United States Patent [19]
Huseman

[11] Patent Number: 5,855,280
[45] Date of Patent: Jan. 5, 1999

[54] CASSETTE LIGHT

[75] Inventor: Brian E. Huseman, Davenport, Fla.

[73] Assignee: Lucent Technologies Inc., Murray Hill, N.J.

[21] Appl. No.: 572,599

[21] Appl. No.:

[22] Filed: Dec. 14, 1995

[51] Int. Cl.[6] ...................................................... A47F 7/00
[52] U.S. Cl. ..................................... 211/41.18; 211/41.12
[58] Field of Search .................................. 211/41.18, 40, 211/41.12

[56] References Cited

U.S. PATENT DOCUMENTS

| | | | |
|---|---|---|---|
| 4,569,452 | 2/1986 | Schulke | 211/41.18 X |
| 5,193,682 | 3/1993 | Naito et al. | 211/41.18 X |
| 5,417,767 | 5/1995 | Stinson | 211/41.18 X |
| 5,538,230 | 7/1996 | Sibley | 211/41.18 X |

Primary Examiner—Alvin C. Chin-Shue
Assistant Examiner—Sarah L. Purol
Attorney, Agent, or Firm—John T. Rehberg

[57] ABSTRACT

An apparatus for the convenient viewing of scribed numbers upon selected wafers is disclosed. The apparatus supports a wafer cassette and raises predetermined wafers and illuminates the identification numbers scribed thereon.

10 Claims, 2 Drawing Sheets

CASSETTE LIGHT

TECHNICAL FIELD

This invention relates to methods and apparatus for wafer handling.

BACKGROUND OF THE INVENTION

Modern integrated circuits are typically fabricated upon silicon wafers. The wafers are usually quite thin and easily susceptible to breakage. To reduce the risk of breakage and simplify wafer handling, wafers are frequently transported in cassettes. For example, FIG. 1 illustrates cassette 11 with a plurality of wafers 12, 13, 14, 15, and 16. Typically, a cassette may hold 25 wafers. As illustrated in FIG. 1, wafer 12 is supported in cassette with its flat side 17 protruding through the bottom 19 of cassette 11.

Often it is desirable to be able to read small numbers which may be scribed on the upper portion of wafers. For example, in FIG. 1, scribed numbers 20, 21, 22, 23, and 24 are positioned on the upper portion of wafers 12, 13, 14, 15, and 16 respectively. When the cassette is filled with wafers, unfortunately, it may be difficult to read the small numbers which are scribed upon the top edges of the wafers.

In the past, practitioners have placed the bottom of cassette 11 upon a solid wedge. The solid wedge forces the wafers upward through the cassette and makes viewing numbers 20–24 somewhat easier. On other occasions, a flashlight is placed under the cassette (without a wedge) to aid in number identification. However, as wafers become larger and scribed numbers become smaller, there remains a continuing need for methods and apparatus for easier viewing of scribed numbers upon wafers. (Only a partially-filled cassette has been shown for convenience.)

SUMMARY OF THE INVENTION

These concerns are addressed by the present invention which illustratively includes:

a base supporting a cassette and at least one raised protrusions contacting the base. The protrusion is positioned beneath a predetermined wafer, thereby raising the wafer slightly from the other wafers.

DETAILED DESCRIPTION

Figure 1:
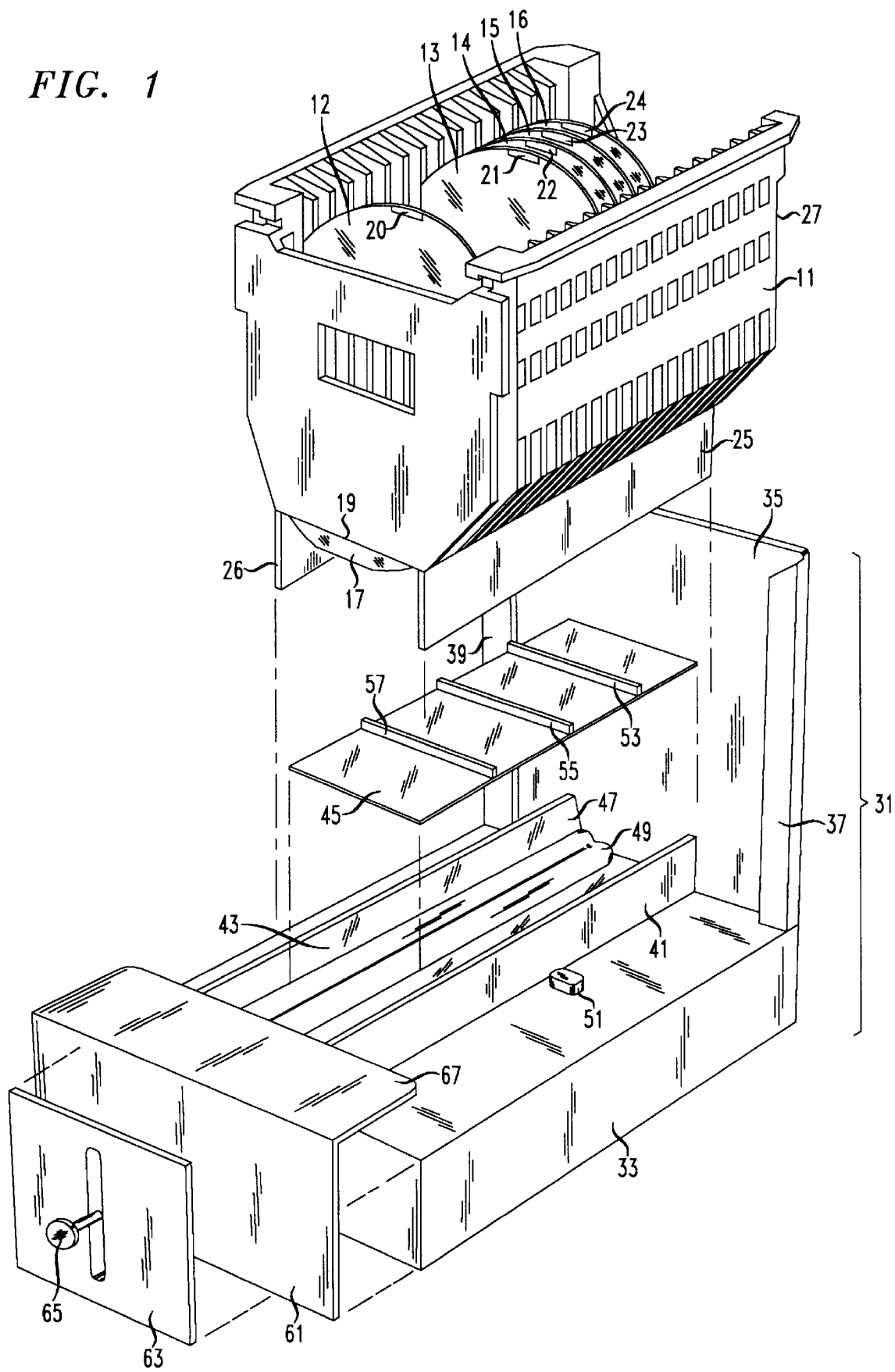
FIGS. 1 and 2 are perspective views useful for understanding an illustrative embodiment of the present invention.
Figure 2:
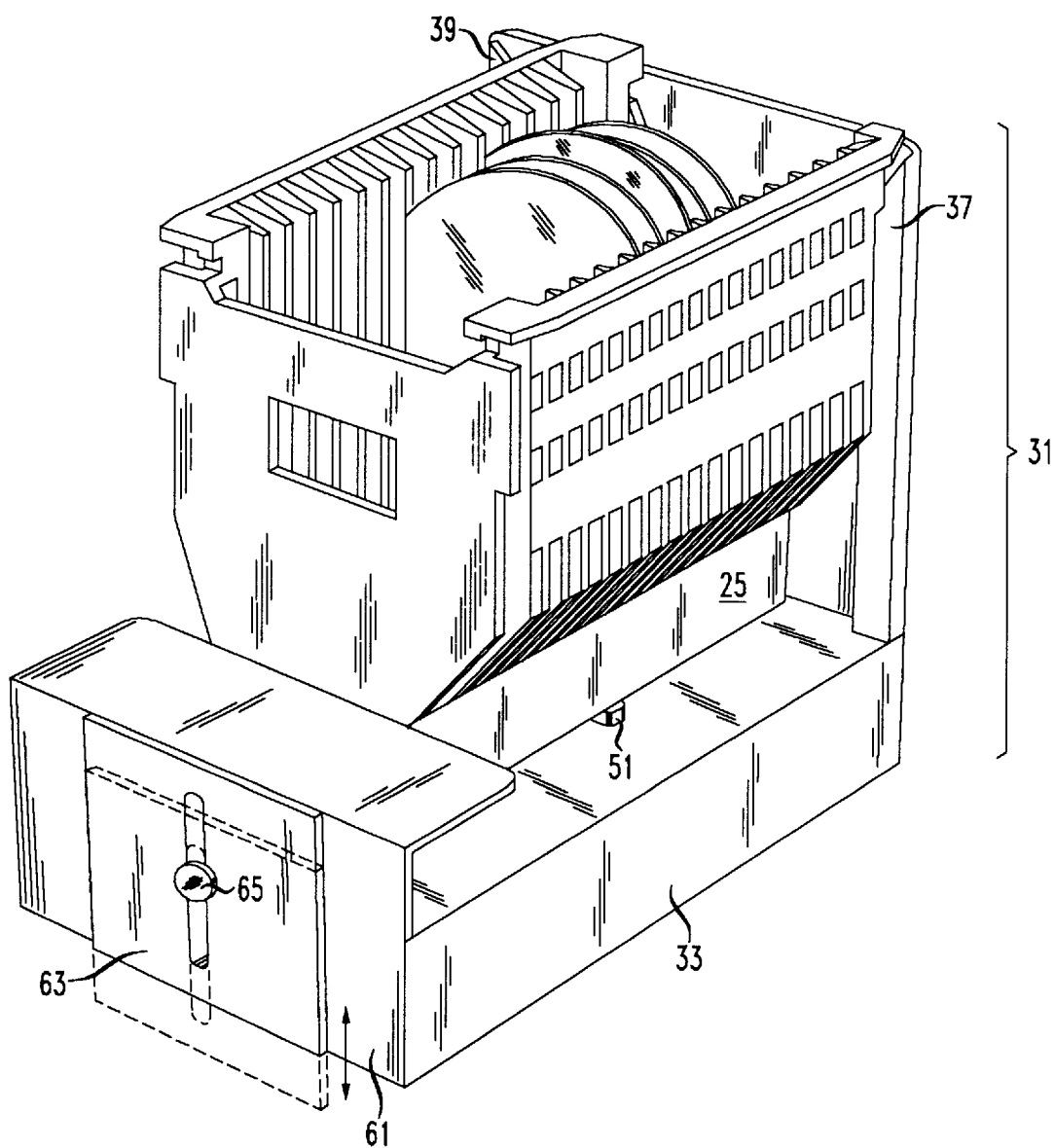

In FIGS. 1 and 2 reference numeral 31 denotes an apparatus for supporting a cassette filled with wafers which facilitates the easy reading of scribed numbers 20–24 upon wafers inside the cassette. Base 33 of the inventive apparatus support legs 25 and 26 of cassette 11. Back plate 35 of the apparatus contacts the back 27 of cassette 11. Channels 37 and 39 in back plate 35 engage the back of cassette 11 and serve to hold cassette 11 in place.

Walls 41 and 43 protrude vertically upward from base 33. Transparent or translucent plate 45 fits over walls 41 and 43 and together therewith defines a channel or cavity 47. The bottom edge 17 of wafers such as wafer 12 may rest upon plate 45.

Fluorescent tube 49 is contained within and extends within cavity 47. Light from fluorescent tube 49 shines through plate 45 and upward into cassette 11, thereby illuminating the scribed numbers 20–24 on the wafers within the cassette. Switch 51 is connected to electrical circuitry which turns on light 49. Switch 51 operates to turn on light 49 when it is depressed by contact with lower leg 25 of cassette 11.

Raised protrusions 53, 55, and 57 upon plate 45 contact predetermined wafers within cassette 11 and raise these wafers slightly. The protrusions may be also made from transparent or translucent plastic. Scribed numbers may be viewed very conveniently upon the three wafers which are raised slightly above the rest of wafers within the cassette. A variety of plates 45 may be provided in accordance with the invention. Each plate 45 may have a plurality of raised protrusions corresponding to different wafer positions within cassette 11 for facilitating the reading of the scribed numbers upon wafers in predetermined locations within the cassette 11. Alternatively, a plurality of movable protrusions may be placed upon plate 45 for facilitating reading of numbers upon predetermined wafers within cassette 11.

Front plate 61 contains electrical connections to fluorescent bulb 49.

Movable plate 63 is attached via adjustable thumb screw 65 to front plate 61. Vertical adjustment of plate 63 and securing of plate by thumb screw 65 tilts apparatus 31 and easy viewing of the entire apparatus 31 and viewing of selected wafers which have been raised and illuminated.

Front edge 67 of front plate 61, together with back plate 35 of apparatus 31 serve to closely hold cassette 11. Consequently, protrusions 53, 55, and 57 are precisely and squarely positioned beneath the desired predetermined wafers whose scribed numbers are to be viewed.

Thus, in operation, one merely places a cassette 11 having a plurality of wafers within it upon apparatus 31. Activation of switch 51 by lower edge 25 of cassette 11 causes light 49 to turn on. Light shines through transparent or translucent plate 45, thereby illuminating the numbers scribed upon the wafers within the cassette. Certain predetermined wafers are automatically raised from the others by contact with protrusions 53–57. Furthermore, the entire apparatus 31 may be tilted slightly away from the viewer by proper adjustment of thumb screw 65 and plate 63.

I claim:

1. An apparatus for viewing wafers in a cassette, said cassette having legs comprising:

a base for supporting said legs;

illumination means attached to said base;

means attached to said base for raising predetermined wafers in said cassette for viewing.

2. The apparatus of claim 1 in which said base has switch means for activating said illumination means.

3. The apparatus of claim 1 further including means for tilting said base.

4. The apparatus of claim 1 further including a plate extending vertically from said base, said plate being adapted to engage and hold said cassette.

5. An apparatus for viewing wafers in a cassette, comprising:

a base for supporting said cassette;

at least one raised protrusion contacting said base, said protrusion being capable of being positioned beneath a predetermined wafer, thereby raising said wafer slightly from other said wafers in said cassette when said wafer contacts said protrusion.

6. The apparatus of claim 5 further including a light attached to said base and positioned to shine upwards through said cassette.

7. The apparatus of claim 5 further including two walls extending upward from said base;

a translucent or transparent plate positioned between said two walls, said walls, said base, and said plate defining a cavity therebetween; and a light positioned within said cavity.

8. The apparatus of claim 7 in which said plate contains at least one protrusion for slightly lifting at least one wafer in said cassette.

9. The apparatus of claim 7 further including a switch upon said base for turning a said light.

10. The apparatus of claim 7 further including a vertical adjustable plate attached to the end of said base; adjustment of said plate causing the tilting of said base.

* * * * *